United States Patent
Dezelah et al.

(10) Patent No.: US 10,995,405 B2
(45) Date of Patent: May 4, 2021

(54) DEPOSITION OF MOLYBDENUM THIN FILMS USING A MOLYBDENUM CARBONYL PRECURSOR

(71) Applicant: Merck Patent GmbH, Darmstadt (DE)

(72) Inventors: Charles Dezelah, Somerville, NJ (US); Jean-Sebastien Lehn, Somerville, NJ (US); Guo Liu, Somerville, NJ (US); Mark C. Potyen, Somerville, NJ (US)

(73) Assignee: MERCK PATENT GMBH, Darmstadt (DE)

( * ) Notice: Subject to any disclaimer, the term of this patent is extended or adjusted under 35 U.S.C. 154(b) by 59 days.

(21) Appl. No.: 15/999,499

(22) PCT Filed: Feb. 17, 2017

(86) PCT No.: PCT/US2017/018455
§ 371 (c)(1),
(2) Date: Aug. 17, 2018

(87) PCT Pub. No.: WO2017/143246
PCT Pub. Date: Aug. 24, 2017

(65) Prior Publication Data
US 2019/0003050 A1   Jan. 3, 2019

Related U.S. Application Data

(60) Provisional application No. 62/297,469, filed on Feb. 19, 2016.

(51) Int. Cl.
*C23C 16/455* (2006.01)
*C23C 16/16* (2006.01)

(52) U.S. Cl.
CPC ........ *C23C 16/45553* (2013.01); *C23C 16/16* (2013.01)

(58) Field of Classification Search
None
See application file for complete search history.

(56) References Cited

U.S. PATENT DOCUMENTS

| | | |
|---|---|---|
| 3,117,983 A | 1/1964 | Matthews |
| 3,489,780 A | 1/1970 | Thompson |
| 4,431,708 A | 2/1984 | Carver et al. |
| 5,073,645 A | 12/1991 | Kruck et al. |
| 2014/0070417 A1* | 3/2014 | Sakata ............ H01L 23/485 257/751 |
| 2014/0283913 A1* | 9/2014 | Whitelegg ........ H01L 31/0749 136/260 |
| 2014/0370192 A1* | 12/2014 | Odedra ............ C23C 16/45553 427/255.6 |

FOREIGN PATENT DOCUMENTS

| | | |
|---|---|---|
| EP | 0209131 A2 | 1/1987 |
| JP | H3110840 A | 5/1991 |
| WO | 2014118751 A1 | 8/2014 |

OTHER PUBLICATIONS

Reiff [Chemistry and Stereochemistry of Reactions of Organophosphorus Ligands in Chiral Mo(CO)5L Complexes] Amer. Chem. Soc. (Year: 1986).*
Hermann [Stereochemical control of transition metal complexes by polyphosphine ligands] Chem. Rev. (Year: 1994).*
Suhr [Plasma CVD using Organometallic Compounds]. Journal Phys. Coll. (Year: 1989).*
Office Action issued in EP Application No. 17709238.4 dated Jan. 22, 2020.
Charles M. Bartish & Charles S. Kraihanzel, "Reactions of Coordinated Ligands. III. Conformational Analysis of Metal Carbonyl Complexes of 2-Substituted 5,5-Dimethyl-1,3,2-dioxaphosphorinanes," 12(2) Inorg. Chem. 391-394 (1973).
K.A. Gesheva, V. Abrosimova & G.D. Beshkov, "CVD Carbonyl Thin Films of Tungsten and Molybdenum and Their Silicides—A Good Alternative to CVD Fluoride Tungsten Technology," 1 J. de Physique IV 865-871 (1991).
Gary M. Gray and Charles S. Kraihanzel, "Reactions of Coordinated Ligands," Journal of Organometallic Chemistry, 146:23-37 (1978).
International Search Report and the Written Opinion of the International Searching Authority, or the Declaration dated Apr. 10, 2017 issued in International Patent Application No. PCT/US2017/018455.
Reiff, L., et al., "Chemistry and Stereochemistry of Reactions of Organophosphorus Ligands in Chiral Mo(CO)5L Complexes", Inorganic Chemistry, 25(9):1451-1455 (1986).
Office Action issued in CN Application No. 201780013427.7 dated Mar. 3, 2020 with English translation.
Office Action issued in corresponding Chinese Application No. 201780013427.7 dated Oct. 13, 2020.
J. Wang, Modern Science and Technique Knowledge Dictionary, Learning Edition (2011).

* cited by examiner

*Primary Examiner* — Mandy C Louie
(74) *Attorney, Agent, or Firm* — Harness Dickey & Pierce P.L.C.

(57) ABSTRACT

Transition metal precursors are disclosed herein along with methods of using these precursors to deposit metal thin films. Advantageous properties of these precursors and methods are also disclosed, as well as superior films that can be achieved with the precursors and methods.

18 Claims, No Drawings

DEPOSITION OF MOLYBDENUM THIN FILMS USING A MOLYBDENUM CARBONYL PRECURSOR

CROSS-REFERENCE TO RELATED APPLICATIONS

This patent application is a U.S. national stage application under 35 U.S.C. § 371 of International Patent Application No. PCT/US2017/018455 filed on 17 Feb. 2017, which claims the benefit of U.S. Provisional Patent Application No. 62/297,469 filed on 19 Feb. 2016. The entire disclosures of each of the above recited applications are incorporated herein by reference.

FIELD OF THE INVENTION

The present invention relates to methods of preparing thin films by chemical vapor deposition (CVD) or atomic layer deposition (ALD) using molybdenum (Mo) carbonyl precursors, and to molybdenum films made by these methods.

BACKGROUND OF THE INVENTION

Various organometallic precursors are used to form thin metal films. A variety of techniques have been used for the deposition of thin films. These include reactive sputtering, ion-assisted deposition, sol-gel deposition, CVD (also known as metalorganic CVD or MOCVD), and ALD (also known as atomic layer epitaxy). The CVD and ALD processes are being increasingly used as they have the advantages of good compositional control, high film uniformity, good control of doping, and, significantly, they give excellent conformal step coverage on highly non-planar microelectronics device geometries.

CVD is a chemical process whereby precursors are used to form a thin film on a substrate. In a typical CVD process, the precursors are passed over a substrate (e.g., wafer) in a low pressure or ambient pressure reaction chamber. The precursors react and/or decompose on the substrate surface creating a thin film of deposited material. Volatile by-products are removed by gas flow through the reaction chamber. The deposited film thickness can be difficult to control because it depends on coordination of many parameters such as temperature, pressure, gas flow volumes and uniformity, chemical depletion effects, and time.

ALD is also a method for the deposition of thin films. It is a self-limiting, sequential, unique film growth technique based on surface reactions that can provide precise thickness control and deposit conformal thin films of materials provided by precursors onto substrates of varying compositions. In ALD, the precursors are separated during the reaction. The first precursor is passed over the substrate producing a monolayer on the substrate. Any excess unreacted precursor is pumped out of the reaction chamber. A second precursor is then passed over the substrate and reacts with the first precursor, forming a second monolayer of film over the first-formed monolayer of film on the substrate surface. This cycle is repeated to create a film of desired thickness. ALD film growth is self-limiting and based on surface reactions, creating uniform depositions that can be controlled at the nanometer-thickness scale.

Thin films have a variety of important applications, such as nanotechnology and fabrication of semiconductor devices. Examples of such applications include conductive films, high-refractive index optical coatings, corrosion-protection coatings, photocatalytic self-cleaning glass coatings, biocompatible coatings, dielectric capacitor layers and gate dielectric insulating films in field-effect transistors (FET), capacitor electrodes, gate electrodes, adhesive diffusion barriers, and integrated circuits. Thin films are also used in microelectronics applications, such as the high-κ dielectric oxide for dynamic random access memory (DRAM) applications and the ferroelectric perovskites used in infra-red detectors and non-volatile ferroelectric random access memories (NV-FeRAMs). The continual decrease in the size of microelectronics components has increased the need for the use of such dielectric thin films.

U.S. Pat. No. 3,489,780 to Thompson reports molybdenum carbonyl derivatives useful for making hydrogenation catalysts.

U.S. Pat. No. 4,431,708 to Carver reports thin films produced by deposition with molybdenum hexacarbonyl precursors.

Gesheva et al. (1991) *Journal de Physique IV* 2(C2):865-71 (DOI: 10.1051/jp4:19912103) also report thin films produced by deposition with molybdenum hexacarbonyl precursors.

WO 2013/112383 to Sigma-Aldrich Co. reports molybdenum allyl complexes and uses thereof in thin film deposition.

Many current molybdenum complexes for use in CVD and ALD do not provide the required performance to implement new processes for fabrication of next generation devices, such as semiconductors. More complexes with improved thermal stability, higher volatility, increased vapor pressures, and increased deposition rates are needed.

SUMMARY OF THE INVENTION

As described herein, thin film deposition can be advantageously improved by using an organometallic precursor corresponding in structure to Formula I:

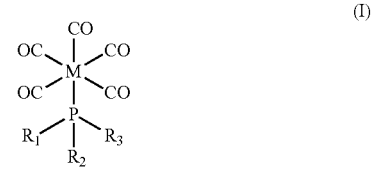

(I)

wherein M is a transition metal selected from the group consisting of Cr, Mo, and W; and wherein $R_1$, $R_2$, and $R_3$ are each independently selected from the group consisting of methyl, ethyl, F, Cl, and Br. In certain embodiments, M is molybdenum and $R_1$, $R_2$, and $R_3$ are each independently selected from the group consisting of methyl and Cl. In certain embodiments, the precursor is (methylphosphonous dichloride)pentacarbonyl molybdenum.

Methods for forming metal-containing films by vapor deposition processes, such as CVD and ALD, are provided herein using organometallic precursors corresponding in structure to Formula I.

In addition, superior quality films made by the methods described immediately above are also described herein.

Other embodiments, including particular aspects of the embodiments summarized above, will be evident from the detailed description that follows.

DETAILED DESCRIPTION OF THE INVENTION

In one embodiment, the methods disclosed herein can be used to create or grow metal-containing thin films—in particular, molybdenum-containing thin films—which display conductive properties.

I. DEFINITIONS

As used herein, "precursor" refers to an organometallic molecule, complex and/or compound which forms a thin film while passing over a substrate during a deposition process, for example, CVD or ALD.

As used herein, "vapor deposition process" refers to any type of vapor deposition technique such as CVD or ALD. In various embodiments of the invention, CVD may take the form of conventional (i.e., continuous flow) CVD, liquid injection CVD, or photo-assisted CVD. CVD may also take the form of a pulsed technique, i.e., pulsed CVD. In other embodiments, ALD may take the form of conventional (i.e., pulsed injection) ALD, liquid injection ALD, photo-assisted ALD, or plasma-assisted ALD. The term "vapor deposition process" further includes various vapor deposition techniques described in *Chemical Vapour Deposition: Precursors, Processes, and Applications*; Jones, A. C.; Hitchman, M. L., Eds. The Royal Society of Chemistry: Cambridge, 2009; Chapter 1, pp 1-36.

As used herein, all five carbon atoms of the carbonyls are bound to the metal center in $\eta^5$-coordination by $\pi$ bonding, therefore the precursors described herein are "$\pi$ complexes."

The term "alkyl" refers to a saturated hydrocarbon chain of 1 to about 8 carbon atoms in length, such as, but not limited to, methyl, ethyl, propyl and butyl. The alkyl group may be straight-chain or branched-chain. "Alkyl" is intended to embrace all structural isomeric forms of an alkyl group. For example, as used herein, propyl encompasses both n-propyl and iso-propyl; butyl encompasses n-butyl, sec-butyl, iso-butyl and tert-butyl. Further, as used herein, "Me" refers to methyl, "Et" refers to ethyl, "Pr" refers to propyl, "i-Pr" refers to iso-propyl, "Bu" refers to butyl, "t-Bu" refers to tert-butyl, "s-Bu" refers to sec-butyl, "i-Bu" refers to iso-butyl, and "Np" refers to neo-pentyl. It should also be noted that $C_2$ is intended to refer to an ethyl group, and not dimethyl.

Deposition of molybdenum metal is difficult because of stability issues, being either unstable or too stable for deposition. The organometallic complexes described in the embodiments of the invention allow for control of physical properties as well as provide for increased stability and simple high yield synthesis.

The words "comprise", "comprises", and "comprising" are to be interpreted inclusively rather than exclusively.

II. ORGANOMETALLIC COMPLEXES

Organometallic precursors corresponding in structure to Formula I are useful in the methods described herein:

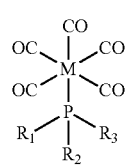

(I)

wherein M is a transition metal selected from the group consisting of Cr, Mo, and W, particularly molybdenum; and wherein $R_1$, $R_2$, and $R_3$ are each independently selected from the group consisting of methyl, ethyl, F, Cl, and Br, particularly methyl and Cl. No stereochemistry is implied or presented in the structure of Formula I.

The structure of Formula I embraces all variations of stereochemistry. For example, in one embodiment, Formula I embraces the following structure of Formula A:

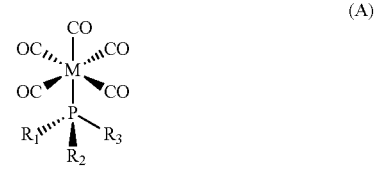

(A)

wherein M is a transition metal selected from the group consisting of Cr, Mo, and W, particularly molybdenum; and wherein $R_1$, $R_2$, and $R_3$ are each independently selected from the group consisting of methyl, ethyl, F, Cl, and Br, particularly methyl and Cl.

Examples of organometallic complexes corresponding in structure to Formula I include (1) (methylphosphonous dichloride)pentacarbonyl molybdenum, (2) (dimethylphosphonous chloride)pentacarbonyl molybdenum, (3) (methylphosphonous dichloride)pentacarbonyl tungsten, (4) (dimethylphosphonous chloride)pentacarbonyl tungsten, (5) (methylphosphonous dichloride)pentacarbonyl chromium, and (6) (dimethylphosphonous chloride)pentacarbonyl chromium. Precursor complex (1) (i.e., (methylphosphonous dichloride)pentacarbonyl molybdenum) may be synthesized by well-known methods, such as those described in Reiff et al. (1986) *Inorg. Chem.* 25:1451-55.

In one embodiment, a mixture of two or more organometallic complexes of Formula I is provided. For example, a mixture of two or more organometallic complexes is provided, such as, but not limited to mixtures of: complexes 1 and 2; complexes 1 and 3; complexes 1 and 4; complexes 1 and 5; complexes 1 and 6; complexes 2 and 3; complexes 2 and 4; complexes 2 and 5; complexes 2 and 6; complexes 3 and 4; complexes 3 and 5; complexes 3 and 6; complexes 4 and 5; complexes 4 and 6; complexes 5 and 6; complexes 1, 2, and 3; complexes 2, 3, and 4; complexes 3, 4, and 5; complexes 4, 5, and 6; complexes 1, 2, 3, and 4; complexes 1, 2, 3, 4, and 5; complexes 1, 2, 3, 4, 5, and 6; etc.

III. METHODS

Methods of forming a metal-containing film—particularly a molybdenum-containing film—by a vapor deposition process are provided. The methods comprise vaporizing at least one organometallic complex corresponding in structure to Formula I as disclosed herein. For example, this may include vaporizing the at least one complex and delivering the at least one complex to a substrate surface or passing the at least one complex over a substrate and/or decomposing the at least one complex on the substrate surface.

In a particular embodiment, the organometallic complexes may be dissolved in an appropriate hydrocarbon or amine solvent. Appropriate hydrocarbon solvents include, but are not limited to aliphatic hydrocarbons, such as hexane, heptane, and nonane; aromatic hydrocarbons, such as toluene and xylene; aliphatic and cyclic ethers, such as diglyme, triglyme, and tetraglyme. Examples of appropriate amine solvents include, without limitation, octylamine and N,N-dimethyldodecylamine. For example, the organometallic complex may be dissolved in toluene to yield a solution with a concentration of about 50 mM to about 1 M.

In another embodiment, at least one complex corresponding in structure to Formula may be delivered "neat" (undiluted by a carrier gas) to a substrate.

In one embodiment, the vapor deposition process is chemical vapor deposition.

In another embodiment, the vapor deposition process is atomic layer deposition.

The ALD and CVD methods of the invention encompass various types of ALD and CVD processes such as, but not limited to, continuous or pulsed injection processes, liquid injection processes, photo-assisted processes, and plasma-assisted processes. For purposes of clarity, the methods of the present invention specifically include direct liquid injection processes. For example, in direct liquid injection CVD ("DLI-CVD"), a solid or liquid complex may be dissolved in a suitable solvent and the solution formed therefrom injected into a vaporization chamber as a means to vaporize the complex. The vaporized complex is then transported/delivered to the substrate. In general, DLI-CVD may be particularly useful in those instances where a complex displays relatively low volatility or is otherwise difficult to vaporize.

In one embodiment, conventional or pulsed injection CVD is used to form a metal-containing thin film by vaporizing and/or passing at least one complex according to Formula I as disclosed herein over a substrate. For conventional and pulsed CVD processes, see for example Smith, Donald (1995). *Thin-Film Deposition: Principles and Practice*. McGraw-Hill.

In certain embodiments, CVD growth conditions for molybdenum complexes according to Formula I can include, but are not limited to:
(1) Substrate temperature: 50-600° C. (e.g., 250-450° C., or even 300-350° C.)
(2) Evaporator temperature: 0-200° C.
(3) Reactor pressure: 0-100 Torr (e.g., 0.5-10 Torr, or even 0.7-2 Torr)
(4) Ar or N gas flow rate: 0-500 sccm
(5) O gas flow rate: 0-500 sccm
(6) H gas flow rate: 0-500 sccm
(7) Run time: will vary according to desired film thickness
(8) H gas:Mo precursor:Ratio≈2:1–10000:1 (e.g., 500:1-1000:1 or 5000:1-10000:1)

In another embodiment, photo-assisted CVD is used to form molybdenum-containing thin film by vaporizing and/or passing at least one molybdenum complex according to Formula I as disclosed herein over a substrate.

In a further embodiment, conventional (i.e., pulsed injection) ALD is used to form a molybdenum-containing thin film by vaporizing and/or passing at least one complex according to Formula I as disclosed herein over a substrate. For conventional ALD processes see, for example, George et al. (1996) *J. Phys. Chem.* 100:13121-31.

In another embodiment, liquid injection ALD is used to form a metal-containing thin film, e.g. a molybdenum film, by vaporizing and/or passing at least one complex according to Formula I as disclosed herein over a substrate, wherein at least one liquid complex is delivered to the reaction chamber by direct liquid injection as opposed to vapor draw by a bubbler. For liquid injection ALD process see, e.g., Potter et al. (2005) *Chem. Vap. Deposition* 11(3):159-69.

Examples of ALD growth conditions for complexes according to Formula I include, but are not limited to:

(1) Substrate temperature: 0-400° C.
(2) Evaporator (Mo source) temperature: 0-200° C.
(3) Reactor pressure: 0-100 Torr
(4) Ar or N gas flow rate: 0-500 sccm
(5) Reactive gas flow rate: 0-500 sccm
(6) Pulse sequence (sec.): The time for each step of the complex/purge/reactive gas/purge cycle varies according to chamber size.
(7) Number of cycles: Varies according to desired film thickness.

In another embodiment, photo-assisted ALD is used to form a molybdenum-containing thin film by vaporizing and/or passing at least one complex according to Formula I as disclosed herein over a substrate. For photo-assisted ALD processes see, e.g., U.S. Pat. No. 4,581,249.

In another embodiment, plasma-enhanced ALD is used to form molybdenum-containing thin films by vaporizing and/or passing at least one complex according to Formula I as disclosed herein over a substrate.

The Formula I organometallic precursors disclosed herein may be liquid, solid, or gaseous when utilized in these methods. Typically, the organometallic complexes are liquid or a low-melting solid at ambient temperatures with a vapor pressure sufficient to allow for consistent transport of the vapor to the process chamber.

In one embodiment, the organometallic precursor according to Formula I is a solid with a melting point less than or equal to about 50° C., less than or equal to about 45° C., less than or equal to about 40° C., less than or equal to about 35° C., or less than or equal to about 30° C.

In one embodiment, the organometallic complexes corresponding to Formula I as disclosed herein are delivered to a substrate in pulses alternating with pulses of an oxygen source, such as a reactive oxygen species. Examples of such oxygen source include, without limitation, $H_2O$, $H_2O_2$, $O_2$, ozone, air, i-PrOH, t-BuOH or $N_2O$.

In one embodiment, a Mo, molybdenum nitride (e.g., MoN, $Mo_2N$, or MoN/$Mo_2N$), and/or a molybdenum oxide (e.g., $MoO_2$, $MoO_3$, or $MoO_2$/$MoO_3$) film can be formed by delivering for deposition at least one complex according to Formula I, independently or in combination with a co-reactant. The co-reactant may be deposited or delivered or passed over a substrate, independently or in combination with the at least one complex. Examples of such co-reactants include, but are not limited to, hydrogen, hydrogen plasma, oxygen, air, water, $H_2O_2$, ammonia, a hydrazine, a borane, a silane, such as a trisilane, ozone or any combination thereof. Examples of suitable boranes include, without limitation, hydridic (i.e. reducing) boranes such as borane, diborane, triborane and the like. Examples of suitable silanes include, without limitation, hydridic silanes such as silane, disilane, trisilane, and the like. Examples of suitable hydrazines include, without limitation, hydrazine ($N_2H_4$) and/or a hydrazine optionally substituted with one or more alkyl groups (i.e., an alkyl-substituted hydrazine) such as methylhydrazine, tert-butylhydrazine, N,N- or N,N'-dimethylhydrazine, and the like.

In a particular embodiment, a co-reactant is used to form a $MoO_2$, $MoO_3$, or $MoO_2$/$MoO_3$ film by delivering for deposition at least one complex according to Formula I, independently or in combination, with a co-reactant such as, but not limited to air, $H_2O$, $O_2$, and/or ozone to a reaction chamber. A plurality of such co-reactants may be used.

In another particular embodiment, a co-reactant is used to form a MoN, $Mo_2N$, or MoN/$Mo_2N$ film by delivering for deposition at least one complex according to Formula I, independently or in combination, with a co-reactant such as, but not limited to ammonia, a hydrazine, or other nitrogen-containing compound, such as but not limited to an amine, to a reaction chamber. A plurality of such co-reactants may be used.

In another particular embodiment, a co-reactant is used to form a molybdenum-containing metal film by delivering for deposition at least one complex according to Formula I, independently or in combination, with a co-reactant such as, but not limited to $H_2$, a hydrazine, a silane such as trisilane, and/or ammonia to a reaction chamber.

In another embodiment, a mixed-metal film can be formed by a vapor deposition process which vaporizes a complex of Formula I disclosed herein in combination, but not necessarily at the same time, with a co-complex having a motal different from molybdenum.

A variety of substrates can be used in the methods of the present invention. For example, the complexes according to Formula I as disclosed herein may be delivered or passed over a variety of substrates such as, but not limited to, silicon such as Si(100), silicon oxide, silicon nitride, tantalum, tantalum nitride, copper, ruthenium, titanium nitride, tungsten, and tungsten nitride.

In particular embodiment, the methods of the invention are utilized for applications such as dynamic random access memory (DRAM) and complementary metal oxide semiconductor (CMOS) for memory and logic applications, on substrates such as silicon chips.

Any of the molybdenum complexes described herein may be used to prepare thin films of molybdenum metal, molybdenum oxides, and/or molybdenum nitrides. Such films may find application as oxidation catalysts, anode materials (e.g., SOFC or LIB anodes), conducting layers, sensors, diffusion barriers/coatings, super- and non-super conducting materials/coatings, tribological coatings, and/or protective coatings. It is understood by one of ordinary skill in the art that film properties (e.g., conductivity) depend on a number of factors, such as the metal(s) used for deposition, the presence or absence of co-reactants and/or co-complexes, the thickness of the film created, the parameters and substrate employed during growth, and subsequent processing.

One of ordinary skill will appreciate that detailed descriptions of methods above involving molybdenum can be adjusted as necessary for other metals—e.g., chromium and tungsten.

Fundamental differences exist between the thermally-driven CVD process and the reactivity-driven ALD process. The requirements for precursor properties to achieve optimum performance vary greatly. In CVD a clean thermal decomposition of the precursor to deposit the required species onto the substrate is critical. However, in ALD such a thermal decomposition is to be avoided at all costs. In ALD, the reaction between the input reagents must be rapid at the surface resulting in formation of the target material on the substrate. However, in CVD, any such reaction between species is detrimental due to their gas phase mixing before reaching the substrate, which could lead to particle formation. In general it is accepted that good CVD precursors do not necessarily make good ALD precursors due to the relaxed thermal stability requirement for CVD precursors. The Formula I precursors described herein possess enough thermal stability and reactivity toward select co-reactants to function as ALD precursors, and they possess clean decomposition pathways at higher temperatures to form desired materials through CVD processes as well. Therefore, Formula I precursors are useful for ALD and CVD processes.

IV. THIN FILMS

Also disclosed herein are films made according to the methods and using the precursors described elsewhere herein. Films formed using the methods described herein employ precursors described elsewhere herein.

These films can have highly advantageous resistivities, for example as low as about 300 $\mu\Omega\cdot$cm, as low as about 275 $\mu\Omega\cdot$cm, as low as about 250 $\mu\Omega\cdot$cm, as low as about 200 $\mu\Omega\cdot$cm, as low as bout 190 $\mu\Omega\cdot$cm, as low as about 180 $\mu\Omega\cdot$cm, as low as about 175 $\mu\Omega\cdot$cm, as low as about 170 $\mu\Omega\cdot$cm, as low as about 165 $\mu\Omega\cdot$cm, as low as about 160 $\mu\Omega\cdot$cm, as low as about 155 $\mu\Omega\cdot$cm, or even as low as about 150 $\mu\Omega\cdot$cm.

The films as disclosed herein are surprisingly pure of contaminants, having no more than about 20% each of phosphorus, carbon, and oxygen, for example no more than about 18%, no more than about 16%, no more than about 14%, no more than about 12%, no more than about 10%, no more than about 5%, or no more than about 1% each of phosphorus, carbon, and oxygen. In certain embodiments, films as disclosed herein contain no detectable amount of each of phosphorus, carbon, and oxygen. A post-deposition anneal at high temperature can eliminate all or nearly all of these impurities and further lower the resistivity.

These films can be any thickness that a user desires. For example, the films can be <5 nm thick, about 5 nm thick, about 10 nm thick, about 15 nm thick, about 20 nm thick, about 30 nm thick, about 40 nm thick, about 50 nm thick, about 75 nm thick, about 100 nm thick, or >100 nm thick.

V. EXAMPLES

The following examples are merely illustrative, and do not limit this disclosure in any way.

Unless otherwise noted, all manipulations were performed under an inert atmosphere (e.g, purified nitrogen or argon) using techniques for handling air-sensitive materials commonly known in the art (e.g., "Schlenk techniques").

CVD of Mo Metal Film Using (Methylphosphonous Dichloride)Pentacarbonyl Molybdenum $[CH_3(Cl)_2P]Mo(CO)_5$ was heated to 40-60° C. in a stainless steel bubbler and delivered into a CVD reactor using nitrogen or hydrogen as a carrier gas. The molybdenum was deposited at ~300° C. to ~400° C. by pulsed CVD. The substrates used were silicon chips having ~1 kÅ thermal $SiO_2$. The films were analyzed using an optical ellipsometer and XRF for thickness, and using a four-point probe for sheet resistance and resistivity. Ellipsometer thickness data were used for resistivity calculations. Selected samples were also analyzed by SEM and XPS.

Example 1

$[CH_3(Cl)_2P]Mo(CO)_5$ was delivered into a CVD reactor using 25 sccm of nitrogen as the carrier gas, and pulsed for ~2 seconds followed by a ~28 second purge. The molybdenum was deposited at ~400° C. for 8 cycles. The film was cooled down in the reactor to ~40° C. under vacuum with nitrogen purge before unloading. Film thickness in the range of 180-600 Å and resistivity in the range of 230-400 $\mu\Omega\cdot$cm were obtained. SEM showed a smooth film with fine grains. XPS analysis confirmed the existence of Mo metal with N and MoOx contaminants on the top surface, which was removed during XPS analysis, and only ~1.7% C and ~0.9% P remaining in the film after 300 seconds of sputtering.

Example 2

$[CH_3(Cl)_2P]Mo(CO)_5$ was delivered into a CVD reactor using 10-30 sccm of hydrogen as the carrier gas and reducing agent, and pulsed for ~2 seconds followed by a ~58 second purge, and deposited at ~400° C. at 0.10 to 2.0 Torr for 15-50 pulses. Samples were either cooled down without annealing to ~40° C. under vacuum with hydrogen purge before unloading, or annealed in-situ at 400° C. in 2 Torr $H_2$ for 30 minutes. Measured film thickness at various points ranged from 80-500 Å with resistivity in the range of 170-300 µΩ·cm. The resistivity was generally less dependent on film thickness. SEM showed a smooth film with fine grains. XPS analysis confirmed the existence of Mo metal with N and MoOx contaminants on top surface only, and ~3.4% C but no P remaining in the film after 300 seconds of sputtering.

Examples 3 & 4 below both involve growing molybdenum thin films with $[CH_3(Cl)_2P]Mo(CO)_5$ using a shower-head deposition tool. When depositing films by pulsed CVD, the temperature was typically allowed to rise by ~15° C. during the hydrogen pulse of each cycle.

Example 3

Molybdenum Film Growth with (Methylphosphonous Dichloride)Pentacarbonyl Molybdenum at 330° C. and 1.3 Torr The film was grown in a shower-head deposition tool with a working pressure of 1.3 Torr. The bubbler was kept at 33° C., and the nitrogen (carrier gas) flow through the bubbler was 5 sccm. The patterned coupon was kept at 330° C. The film was grown by repeating 14 times the following cycle:
a) Flow the $[CH_3(Cl)_2P]Mo(CO)_5$ and carrier gas in the deposition chamber for ~15 seconds.
b) Evacuate the deposition chamber with full vacuum for ~20 seconds.
c) Purge the deposition chamber with nitrogen (140 sccm) for ~20 seconds.
d) Evacuate the deposition chamber with full vacuum for ~20 seconds.
e) Flow the hydrogen (85 sccm) co-reactant in the deposition chamber for ~240 seconds. The temperature may fluctuate between 315° C. and 345° C. during the hydrogen pulse.
f) Evacuate the deposition chamber with full vacuum for ~20 seconds.
g) Purge the deposition chamber with nitrogen (140 sccm) for ~35 seconds.
h) Evacuate the deposition chamber with full vacuum for ~20 seconds.

Example 4

Molybdenum Film Growth with (Methylphosphonous Dichloride)Pentacarbonyl Molybdenum at 330° C. and 0.7 Torr The film was grown in a shower-head deposition tool with a working pressure of 0.7 Torr. The bubbler was kept at 33° C., and the nitrogen (carrier gas) flow through the bubbler was 5 sccm. The patterned coupon was kept at 330° C. The film was grown by repeating 13 times the following cycle:
a) Flow the $[CH_3(Cl)_2P]W(CO)_5$ and carrier gas in the deposition chamber for ~15 seconds.
b) Evacuate the deposition chamber with full vacuum for ~20 seconds.
c) Purge the deposition chamber with nitrogen (140 sccm) for ~20 seconds.
d) Evacuate the deposition chamber with full vacuum for ~20 seconds.
e) Flow the hydrogen (85 sccm) co-reactant in the deposition chamber for ~450 seconds. The temperature may fluctuate between 315° C. and 345° C. during the hydrogen pulse.
f) Evacuate the deposition chamber with full vacuum for ~20 seconds.
g) Purge the deposition chamber with nitrogen (140 sccm) for ~35 seconds.
h Evacuate the deposition chamber with full vacuum for ~20 seconds.

Example 5

Tungsten Film Growth with (Methylphosphonous Dichloride)Pentacarbonyl Tungsten at 330° C. and 1.3 Torr The film is grown in a shower-head deposition tool with a working pressure of 1.3 Torr. The bubbler is kept at 33° C., and the nitrogen (carrier gas) flows through the bubbler at 5 sccm. The patterned coupon is kept at 330° C. The film is grown by repeating 13 times the following cycle:
a) Flowing the $[CH_3(Cl)_2P]W(CO)_5$ and carrier gas in the deposition chamber for ~15 seconds
b) Evacuating the deposition chamber with full vacuum for ~20 seconds.
i) Purging the deposition chamber with nitrogen (140 sccm) for ~20 seconds.
j) Evacuating the deposition chamber with full vacuum for ~20 seconds.
k) Flowing the hydrogen (85 sccm) co-reactant in the deposition chamber for ~240 seconds. The temperature may fluctuate between 315° C. and 345° C. during the hydrogen pulse.
l) Evacuating the deposition chamber with full vacuum for ~20 seconds.
m) Purging the deposition chamber with nitrogen (140 sccm) for ~35 seconds.
n) Evacuating the deposition chamber with full vacuum for ~20 seconds.

Example 6

Tungsten Film Growth with (Methylphosphonous Dichloride)Pentacarbonyl Tungsten at 330° C. and 0.7 Torr The film is grown in a shower-head deposition tool with a working pressure of 0.7 Torr. The bubbler is kept at 33° C., and the nitrogen (carrier gas) flows through the bubbler at 5 sccm. The patterned coupon is kept at 330° C. The film is grown by repeating 13 times the following cycle:
a) Flowing the $[CH_3(Cl)_2P]W(CO)_5$ and carrier gas in the deposition chamber for ~15 seconds.
b) Evacuating the deposition chamber with fill vacuum for ~20 seconds.
c) Purging the deposition chamber with nitrogen (140 sccm) for ~20 seconds.
d) Evacuating the deposition chamber with full vacuum for ~20 seconds.
e) Flowing the hydrogen (85 sccm) co-reactant in the deposition chamber for ~450 seconds. The temperature may fluctuate between 315° C. and 345° C. during the hydrogen pulse.

f) Evacuating the deposition chamber with full vacuum for ~20 seconds.
g) Purging the deposition chamber with nitrogen (140 sccm) for ~35 seconds.
h) Evacuating the deposition chamber with full vacuum for ~20 seconds.

All patents and publications cited herein are incorporated by reference into this application in their entirety and for all purposes, as if fully set forth herein.

What is claimed is:

1. A method for forming a molybdenum-containing film by chemical vapor deposition or atomic layer deposition, the method comprising delivering at least one organometallic precursor of the formula $[CH_3(Cl)_2P]Mo(CO)_5$ to a substrate.

2. The method of claim 1, wherein the chemical vapor deposition is selected from the group consisting of pulsed chemical vapor deposition, liquid injection chemical vapor deposition, and continuous flow chemical vapor deposition and the atomic layer deposition is liquid injection atomic layer deposition or plasma-enhanced atomic layer deposition.

3. The method of claim 1, wherein the substrate is at a temperature from 250° C. to 450° C.

4. The method of claim 3, wherein the temperature is a temperature from 300° C. to 350° C.

5. The method of claim 4, wherein the temperature is a temperature from 330° C. to 345° C.

6. The method of claim 1, wherein the deposition process is conducted in a chamber pressure from 0.2 Torr to 10 Torr.

7. The method of claim 6, wherein the pressure is a pressure from 0.7 Torr to 2 Torr.

8. The method of claim 6, wherein the pressure is a pressure from 0.7 Torr to 1.3 Torr.

9. The method of claim 1, wherein the substrate is exposed to hydrogen for at least 2 seconds for every 1 second of organometallic precursor exposure.

10. The method of claim 9, wherein the substrate is exposed to hydrogen for at least 14 seconds for every 1 second of organometallic precursor exposure.

11. The method of claim 10, wherein the substrate is exposed to hydrogen for at least 100 seconds for every 1 second of organometallic precursor exposure.

12. The method of claim 1, wherein the substrate is exposed to hydrogen and the organometallic precursor simultaneously.

13. The method of claim 12, wherein the substrate is exposed to a dose per unit time of hydrogen that is at least 2 times greater than that of the organometallic precursor.

14. The method of claim 13, wherein the substrate is exposed to a dose per unit time of hydrogen that is at least 14 times greater than that of the organometallic precursor.

15. The method of claim 14, wherein the substrate is exposed to a dose per unit time of hydrogen that is at least 100 times greater than that of the organometallic precursor.

16. The method of claim 1, wherein the molybdenum-containing film has a resistivity of no more than about 190 $\mu\Omega\cdot cm$ or no more than about 185 $\mu\Omega\cdot cm$.

17. The method of claim 1, the molybdenum-containing film contains no more than about 20% of each of carbon, phosphorus, and oxygen.

18. The method of claim 1, the molybdenum-containing film contains no more than about 15% of each of carbon, phosphorus, and oxygen.

* * * * *